United States Patent
Chung et al.

(10) Patent No.: US 8,102,688 B2
(45) Date of Patent: Jan. 24, 2012

(54) SEMICONDUCTOR MEMORY DEVICES WITH INTERFACE CHIPS HAVING MEMORY CHIPS STACKED THEREON

(75) Inventors: Hoe-ju Chung, Gyeonggi-do (KR); Jung-bae Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 12/367,213

(22) Filed: Feb. 6, 2009

(65) Prior Publication Data

US 2009/0237971 A1    Sep. 24, 2009

(30) Foreign Application Priority Data

Mar. 19, 2008    (KR) .................. 10-2008-0025379

(51) Int. Cl.
*G11C 5/02* (2006.01)
(52) U.S. Cl. .. 365/51; 365/63; 365/189.01; 365/189.17; 365/230.08; 365/233.13; 257/686; 257/777
(58) Field of Classification Search ............ 365/51, 365/63, 189.01, 189.17, 230.08, 233.13; 257/686, 777
See application file for complete search history.

(56) References Cited

U.S. PATENT DOCUMENTS

| | | | |
|---|---|---|---|
| 5,502,667 A * | 3/1996 | Bertin et al. ............. | 365/51 |
| 6,317,352 B1 | 11/2001 | Halbert et al. | |
| 7,095,661 B2 | 8/2006 | Osaka et al. | |
| 7,102,905 B2 * | 9/2006 | Funaba et al. ............ | 365/51 |
| 2004/0221186 A1 * | 11/2004 | Lee et al. ............. | 713/300 |
| 2006/0181944 A1 * | 8/2006 | Chung ..................... | 365/201 |
| 2007/0030814 A1 | 2/2007 | Shin et al. | |
| 2007/0079085 A1 * | 4/2007 | Ruckerbauer ............ | 711/158 |

FOREIGN PATENT DOCUMENTS

| | | |
|---|---|---|
| JP | 2005-141829 A | 6/2005 |
| JP | 2005-209168 A | 8/2005 |
| KR | 10-2007-0016485 A | 2/2007 |

\* cited by examiner

*Primary Examiner* — Pho M Luu
*Assistant Examiner* — Thao Bui
(74) *Attorney, Agent, or Firm* — Myers Bigel Sibley & Sajovec, P.A.

(57) ABSTRACT

A semiconductor memory device includes a controller, a plurality of substrates, and a plurality of stacked memories that are spaced apart and sequence on each of the substrates. Each of the stacked memories includes an interface chip that is connected to the respective substrate and a plurality of memory chips that are stacked on the interface chip. The controller is configured to control the stacked memories. The interface chips are configured to forward a command signal from the controller through each interface chip in the sequence of stacked memories that is intervening between the controller and a selected stacked memory to which the command signal is directed. The interface chips may forward the command signal from one end of the sequence of the stacked memories on one of the substrates to the selected stacked memory, and forward a response signal from the selected stacked memory through the remaining stacked memories in the sequence on the substrate back to the controller or through the same sequence of stacked memories that was taken by the command signal.

21 Claims, 5 Drawing Sheets

SEMICONDUCTOR MEMORY DEVICES WITH INTERFACE CHIPS HAVING MEMORY CHIPS STACKED THEREON

CROSS-REFERENCE TO RELATED PATENT APPLICATIONS

This application claims the benefit of Korean Patent Application No. 10-2008-0025379, filed on Mar. 19, 2008, in the Korean Intellectual Property Office, the disclosure of which is incorporated herein in its entirety by reference.

FIELD OF THE INVENTION

The present invention relates to semiconductor memory devices and, more particularly, to semiconductor memory devices having memory modules in which an interface chip and a plurality of memory chips are stacked.

BACKGROUND

In an attempt to increase the performance and capacity of memory devices, a plurality of memory chips can be interconnected to form a memory module, such as a dynamic random access memory (DRAM), on a printed circuit board (PCB).

Such memory modules may be classified into single in-line memory modules (SIMMs), in which a plurality of memory chips are connected to one surface of a PCB, and dual in-line memory modules (DIMMs), in which a plurality of memory chips are connected to both surfaces of a PCB. An FBDIMM (fully buffered DIMM) is one type of DIMM that has been developed to allow high-operating speed and large memory capacity using a packet protocol. The FBDIMM includes an interface chip for converting a packet type serial interface into a DRAM interface. The interface chip is a unit that transforms a high-speed packet received from a host, such as a microprocessor, into a memory command, and provides an interface between a received signal and a transmitted signal. In general, the interface chip is referred to as an advanced memory buffer (AMB) chip.

FIG. 1 is a block diagram of a conventional semiconductor memory device 100 that is configured as a FBDIMM. Referring to FIG. 1, the semiconductor memory device 100 includes a controller 110, a first memory module 120, and a second memory module 130. The first memory module 120 is connected to an interface chip, e.g., a first AMB chip AMB_1, and a plurality of memory chips 121, 122, ..., 128. Similarly, the second memory module 130 is connected to a second AMB chip AMB_2 and a plurality of memory chips 131, 132, ..., 138. The controller 110 exchanges a signal, e.g., an address, a command, or data, with the first and second memory modules 120 and 130.

When the controller 110 transmits a signal related to the first memory module 120, the first AMB chip AMB_1 receives the signal and transmits it to a corresponding memory chip of the first memory module 120. If the controller 110 transmits a signal related to the second memory module 130, the first AMB chip AMB_1 receives the signal and transmits it to the AMB chip AMB_2. Then, the second AMB chip AMB_2 receives the signal and transmits it to a corresponding memory chip of the second memory module 130.

For example, in order to read data from the memory chip 123, the controller 110 transmits a read command for reading the data from the memory chip 123 to the first AMB chip AMB_1. The first AMB chip AMB_1 receives the read command and transmits it to the memory chip 123, and the memory chip 123 performs a read operation. The data read through the read operation is transmitted to the controller 110 via the first AMB chip AMB_1. In order to read data from the memory chip 136, the controller 110 transmits a read command for reading the data from the memory chip 136 to the first AMB chip AMB_1. Since the read command is not related to the first memory module 120, the first AMB chip AMB_1 delivers the read command to the second AMB chip AMB_2. Then, the second AMB chip AMB_2 receives the read command and transmits it to the memory chip 136, and the memory chip 136 performs a read operation. The data read through the read operation is transmitted to the controller 110 via the first AMB chip AMB_1 and the second AMB chip AMB_2. When a command or data is transmitted as described above, unidirectional signal transmission is performed between the controller 110 and the first AMB chip AMB_1 and between the first AMB chip AMB_1 and the second AMB chip AMB_2, and bidirectional signal transmission is performed between the first AMB chip AMB_1 and the memory chips 121, ..., 128 and between the second AMB chip AMB_2 and the memory chips 131, ..., 138.

SUMMARY

Some embodiments of the present invention are directed to a semiconductor memory device having a plurality of stacked memory chips and which may be capable of reducing power consumption and/or shortening the length of a signal transmission path to the stacked memory chips.

According to some embodiments of the present invention, a semiconductor memory device includes first through mth substrates, where m is a natural number greater than 1, and first through nth stacked memories that are spaced apart and connected to each of the first through mth substrates, where n is a natural number. Each of the first through nth stacked memories includes an interface chip that is connected the respective substrate and further includes a plurality of memory chips stacked on the interface chip. A kth one of the interface chips transmits a signal to a k+1th interface chip connected to the same substrate, where k is a natural number that is equal to or greater than 1 and is less than or equal to n−1.

The semiconductor memory device can further include a controller that is configured to control the first through nth stacked memories connected to each of the first through mth substrates. The controller transmits a command signal, which is directed to the nth interface chip connected to the first substrate, to the first one of the interface chips connected to the first substrate and which relays the command signal to the nth interface chip connected to the first substrate, and the controller receives a response signal from the nth interface chip connected to the first substrate.

The kth interface chip may forward the command signal to the k+1th interface chip using a first signaling mode. The controller may transmit the command signal to the first interface chip and receive the response signal from the nth interface chip using a second signaling mode that is different than the first signaling mode. The controller and stacked memories can thereby be configured so that power consumption in the first signaling mode is less than in the second signaling mode.

The controller may transmit a command signal, which is directed to the first interface chip connected to an a+1th substrate, through the first interface chip connected to an ath substrate, where a is a natural number equal to or greater than 1 and less than or equal to m−1. The first interface chip connected to the ath substrate can respond to the command signal by transmitting the command signal to the first interface chip connected to the a+1th substrate. The nth interface chip connected to the ath substrate can receive a response signal from the nth interface chip connected to the a+1th substrate.

According to some other embodiments of the present invention, a semiconductor memory device includes first through mth substrates, where m is a natural number greater than 1, and first through nth stacked memories that are spaced apart and connected to each of the first through mth substrates, where n is a natural number. Each of the first through nth stacked memories includes an interface chip that is connected to the respective substrate and further includes a plurality of memory chips stacked on the interface chip. A kth one of the interface chips exchanges a signal with a k+1th interface chip connected to the same substrate, where k is a natural number that is equal to or greater than 1 and is less than or equal to n−1.

The semiconductor memory device can further include a controller that is configured to control the first through nth stacked memories connected to each of the first through mth substrates. The controller may exchange signals with the first interface chip connected to the first substrate to read data from one of the stacked memories on one of the substrates other than the first substrate.

According to some other embodiments of the present invention, a semiconductor memory device includes a controller, a plurality of substrates, and a plurality of stacked memories that are spaced apart and sequence on each of the substrates. Each of the stacked memories includes an interface chip that is directly connected to the respective substrate and a plurality of memory chips that are stacked on the interface chip. The controller is configured to control the stacked memories. The interface chips are configured to forward a command signal from the controller through each interface chip in the sequence of stacked memories that is intervening between the controller and a selected stacked memory to which the command signal is directed.

The interface chips can be further configured to forward the command signal from one end of the sequence of the stacked memories on one of the substrates to the selected stacked memory, and to forward a response signal from the selected stacked memory through the remaining stacked memories in the sequence on the substrate back to the controller.

One of the interface chips at an end of the sequence of the stacked memories on a first substrate can be configured to forward the command signal to one of the interface chips at an end of the sequence of the stacked memories on a second substrate when the selected stacked memory is not on the first substrate.

The stacked memories on a plurality of the substrates can be connected in a continuous sequence. The interface chips can be further configured to forward the command signal from one end of the sequence of the stacked memories to the selected stacked memory, and to forward a response signal from the selected stacked memory back to the controller along the same path through the same sequence of stacked memories that was taken by the command signal.

The interface chips can be further configured to forward the command signal from one end of the sequence of the stacked memories to the selected stacked memory on the same substrate, and to forward a response signal from the selected stacked memory back to the controller along the same path through the same sequence of stacked memories that was taken by the command signal.

According to some other embodiments of the present invention, a semiconductor memory device includes first through mth substrates, where m is a natural number; and first through nth stacked memories respectively include first through nth interface chips connected to each of the first through mth substrates. A plurality of memory chips are stacked on each of the first through nth interface chips in the vertical direction, where n is a natural number. A kth interface chip transmits a signal to a k+1th interface chip connected to the same substrate, where k is a natural number equal to or greater than 1 and less than or equal to n−1.

The semiconductor memory device may further include a controller that is configured to control the first through nth stacked memories connected to each of the first through mth substrates. The controller may transmit a signal to the first interface chip connected to the first substrate and receive a signal from the nth interface chip connected to the first substrate.

The first interface chip connected to an ath substrate may transmit a signal to the first interface chip connected to an a+1th substrate, where a is a natural number equal to or greater than 1 and less than or equal to m−1. The nth interface chip connected to the ath substrate may receive a signal from the nth interface chip connected to the a+1th substrate.

According to some other embodiments of the present invention, a semiconductor memory device includes first through mth substrates, where m is a natural number; and first through nth stacked memories respectively including first through nth interface chips connected to each of the first through mth substrates. A plurality of memory chips are stacked on each of the first through nth interface chips in the vertical direction, where n is a natural number. A kth interface chip exchanges a signal with a k+1th interface chip connected to the same substrate, where k is a natural number equal to or greater than 1 and less than or equal to n−1.

The semiconductor memory device may further include a controller that is configured to control the first through nth stacked memories connected to each of the first through mth substrates. The controller exchanges a signal with the first interface chip connected to the first substrate.

The nth interface chip connected to an ath substrate may exchange a signal with the first interface chip connected to an a+1th substrate, where a is a natural number equal to or greater than 1 and less than or equal to m−1.

The semiconductor memory device may further include a controller that is configured to control the first through nth stacked memories connected to each of the first through mth substrates. The controller exchanges a signal with an ith interface chip connected to the first substrate, where i is a natural number equal to or greater than 2 and less than or equal to n−1.

The ith interface chip connected to an ath substrate may exchange a signal with the ith interface chip connected to an a+1th substrate, where a is a natural number equal to or greater than 1 and less than or equal to m−1.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE EMBODIMENTS

Figure 1:
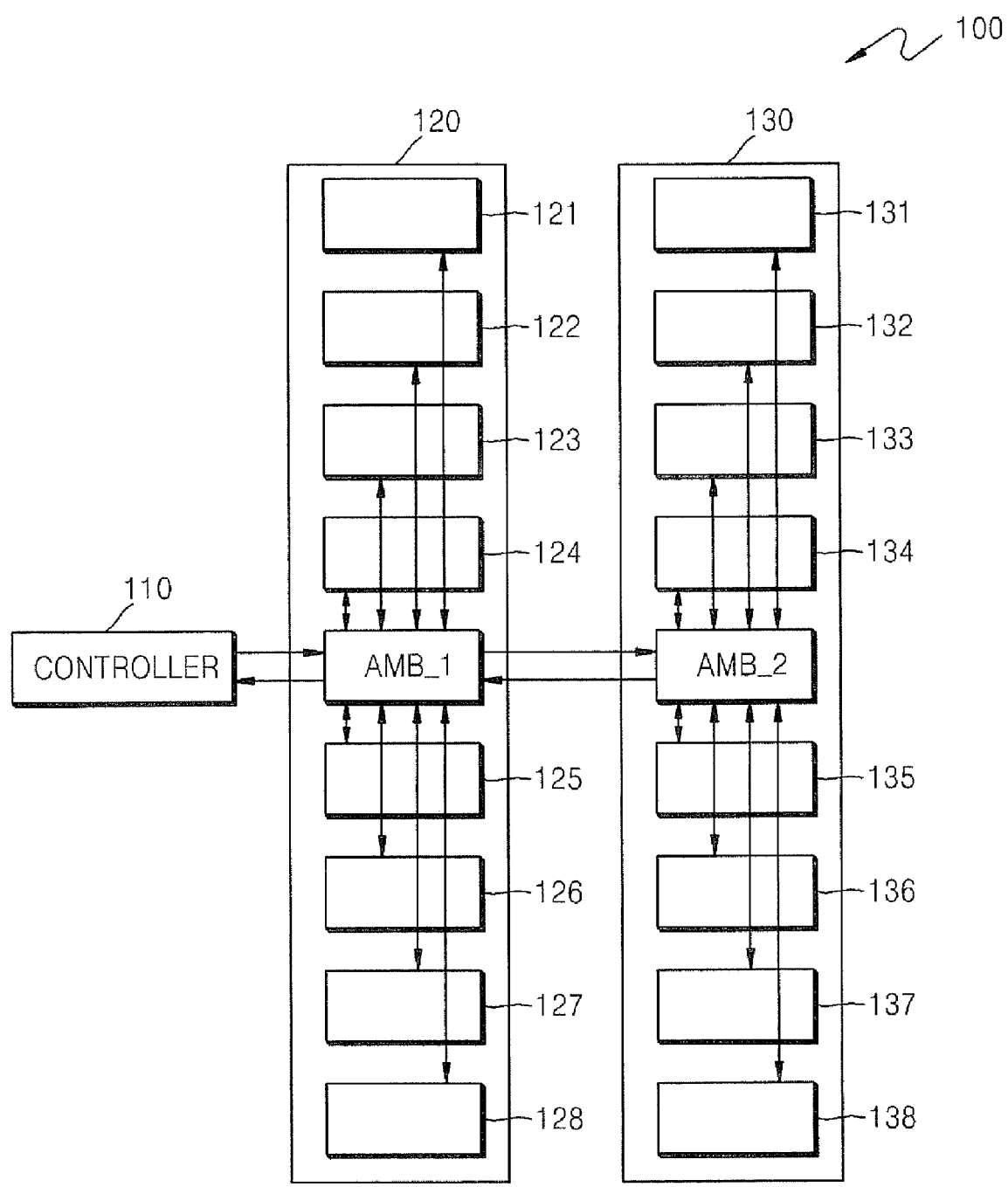
FIG. 1 is a block diagram of a conventional semiconductor memory device having a fully buffered dual in-line memory module (FBDIMM)

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses sizes of layers and regions are exaggerated for clarity. Like reference numerals in the drawings denote like elements. A semiconductor substrate described in the present specification denotes not only the semiconductor substrate itself, but also a structure in/on which the semiconductor substrate is formed by various processes.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2A:
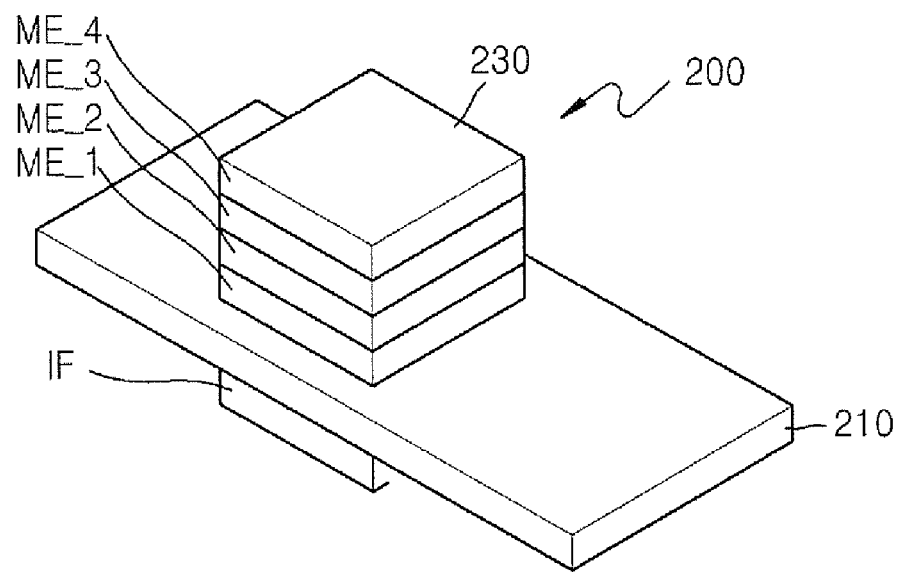
FIG. 2A illustrates a memory module according to some embodiments of the present invention.
Figure 2B:
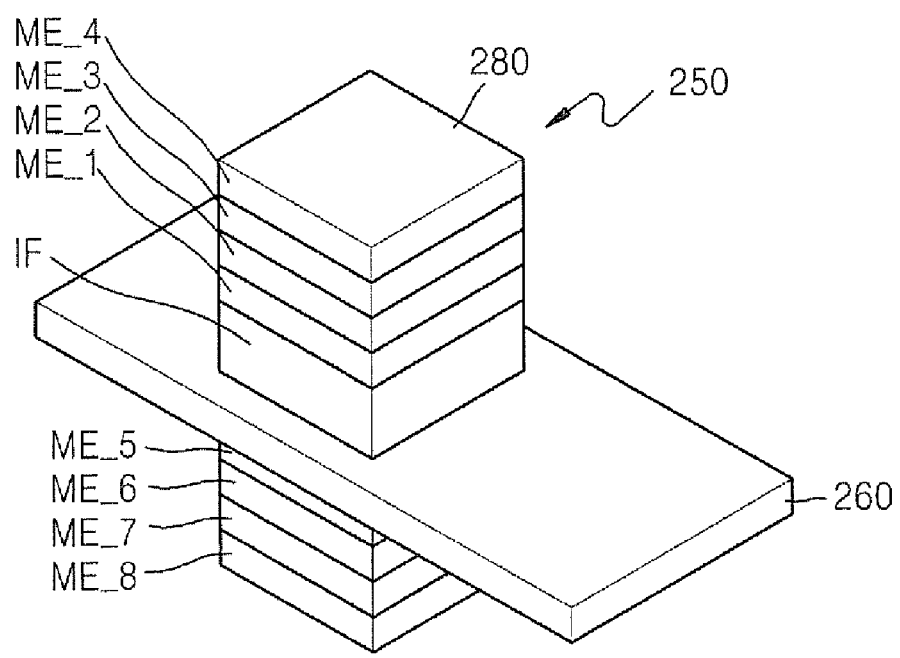
FIG. 2B illustrates a memory module according to other embodiments of the present invention.

FIG. 2A illustrates a memory module 200 according to some embodiments of the present invention. FIG. 2B illustrates a memory module 250 according to other embodiments of the present invention.

Referring to FIG. 2A, the memory module 200 may include a substrate 210 and a stacked memory 230. The substrate 210 may be a printed circuit board (PCB). The stacked memory 230 may include an interface chip IF and a plurality of memory chips ME_1, ME_2, ME_3, and ME_4. The interface chip IF is configured to transmit signals therefrom to selected ones of the memory chips ME_1, ME_2, ME_3, and ME_4, and to transmit signals that are received from the memory chips ME_1, ME_2, ME_3, and ME_4 to other external circuitry (e.g., to a processor controller). When the memory module 200 is configured as a fully buffered dual in-line memory module (FBDIMM), the interface chip IF may be configured as an advanced memory buffer (AMB) chip. Each of the memory chips ME_1, ME_2, ME_3, and ME_4 includes a memory core that includes a plurality of memory cells. For example, the memory chips ME_1, ME_2, ME_3, and ME_4 may be configured as dynamic random access memory (DRAM). The interface chip IF may therefore include a memory core that includes of a plurality of memory cells. Accordingly, the interface chip IF can be configured to not only transmit and receive signals with the memory chips ME_1, ME_2, ME_3, and ME_4, but it can also store data in it's internal memory core. Hereinafter, an interface chip IF may or may not include the memory core.

Although FIG. 2A illustrates that the four memory chips ME_1, ME_2, ME_3, and ME_4 are stacked on the interface chip IF, it is to be understood that any number of memory chips can be stacked on the interface chip IF in accordance with various other embodiments.

Referring to FIG. 2B, the memory module 250 may include a substrate 260 and a stacked memory 280. In contrast to the memory module 200 of FIG. 2A, a plurality of memory chips ME_1 through ME_8 are stacked on opposite surfaces of the substrate 260 in the memory module 250 of FIG. 2B. In detail, an interface chip IF is attached to one side of the substrate 260, the memory chips ME_1, ME_2, ME_3, and ME_4 are stacked on an opposite surface of the interface chip IF from the substrate 260, and the memory chips ME_5, ME_6, ME_7, and ME_8 are stacked on the opposite surface of the interface chip IF. Similarly, as described above with reference to FIG. 2A, any number of memory chips can be stacked on the interface chip IF in accordance with various other embodiments.

Figure 3:
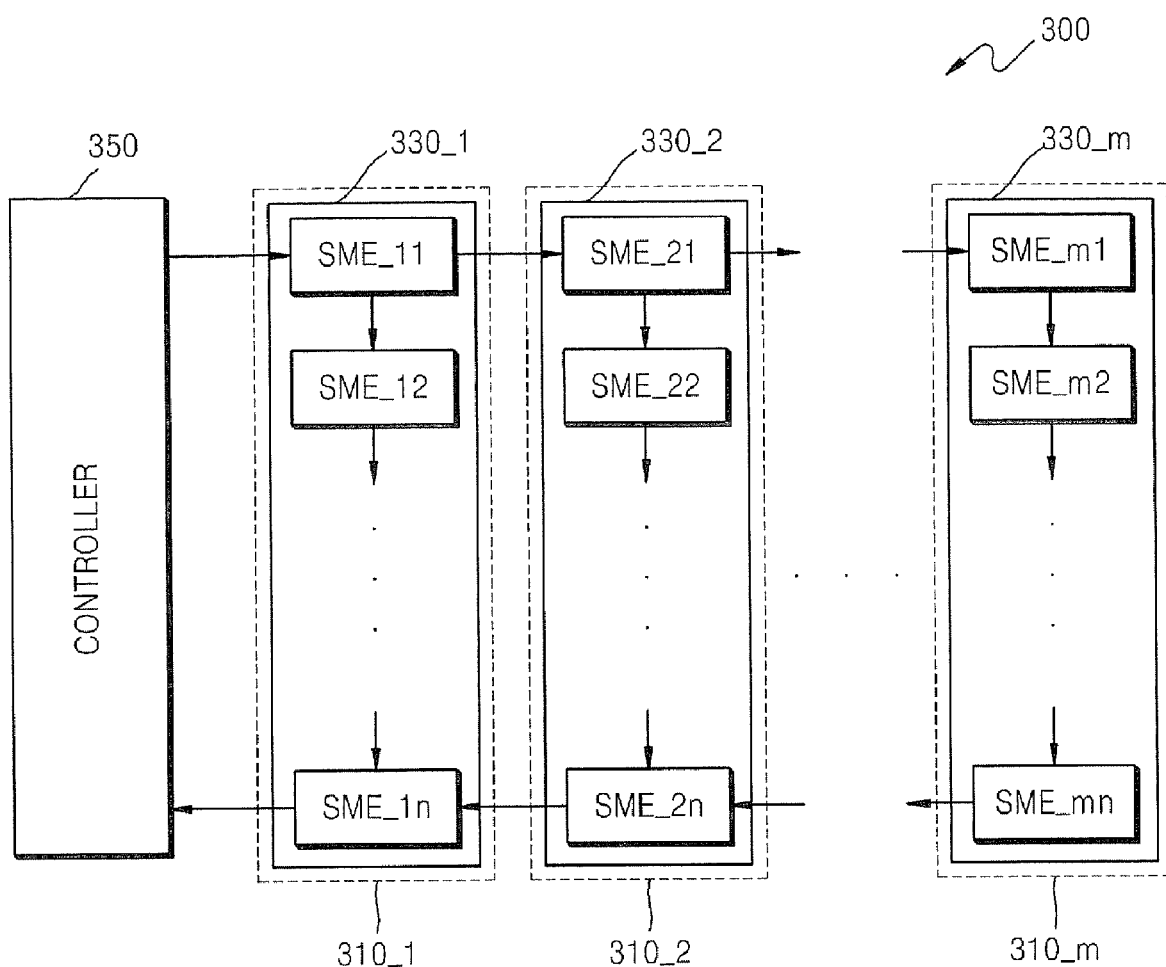
FIG. 3 is a block diagram of a semiconductor memory device according to some embodiments of the present invention.

FIG. 3 is a block diagram of a semiconductor memory device 300 according to some embodiments of the present invention. Referring to FIG. 3, the semiconductor memory device 300 may include first through mth memory modules 310_1, 310_2, ... 310_m, and a controller 350. Each of the first through mth memory modules 310_1, 310_2, . . . , 310_m may include a corresponding substrate from among first through mth substrates 330_1, 330_2, ..., 330_m, and corresponding n stacked memories from among first through nth stacked memories SME_11, SME_12, ..., SME_mn. That is, the first memory module 310_1 may include the first substrate 330_1 and the first through nth stacked memories SME_11, SME_12, ..., SME_1n. The mth memory module 310_m may include the mth substrate 330_m and the first through nth stacked memories SME_m1, SME_m2, ..., SME_mn. Similarly, each of the other memory modules may also include a corresponding substrate and first through nth stacked memories.

The first through nth stacked memories SME_11, SME_12, ..., SME_mn included in the first through mth memory modules 310_1, 310_2, ..., 310_m may be realized as illustrated in FIG. 2A or 2B. That is, although not shown, the first stacked memory SME_11 connected to the first substrate 330_1 may include a first interface chip connected to the first substrate 330_1, and a plurality of memory chips stacked on the first interface chip in the vertical direction. Also, the nth stacked memory SME_1n connected to the first substrate 330_1 may include an nth interface chip connected to the first substrate 330_1, and a plurality of memory chips stacked on the nth interface chip in the vertical direction. Similarly, the other stacked memories may include an interface chip and a plurality of memory chips.

The controller 350 can exchange a signal, e.g., an address, a command, and/or data, with the first through mth memory modules 310_1, 310_2, ..., 310_m. That is, the controller 350 can control the first through nth stacked memories SME_11, SME_12, ..., SME_mn connected to the respective substrates 330_1 through 330_m by exchanging the signal with the first through nth stacked memories SME_11, SME_12, ..., SME_mn.

The controller 350 transmits a signal to the interface chip of the first stacked memory SME_11 connected to the first substrate 330_1. If the signal is related to the first memory module 310_1, the interface chip of the first stacked memory SME_11 transmits the signal to the interface chip of the second stacked memory SME_12 connected to the first substrate 330_1. If the signal is related to the second memory module 310_2, the interface chip of the first stacked memory SME_11 does not transmit the signal to the interface chip of the second stacked memory SME_12, but instead transmits it to the interface chip of the first stacked memory SME_21 connected to the second substrate 330_2. The interface chip of the nth stacked memory SME_1n connected to the first substrate 330_1 transmits the signal to the controller 350.

For example, in order to read data from the second stacked memory SME_12 connected to the first substrate 330_1, the controller 350 transmits a read command for reading the data from the second stacked memory SME_12 to the interface chip of the first stacked memory SME_11 connected to the first substrate 330_1. The read command is related to the first memory module 310_1, and thus, the interface chip of the first stacked memory SME_11 does not transmit the read command to the interface chip of the first stacked memory SME_21 connected to the second substrate 330_2, but instead transmits it to the interface chip of the second stacked memory SME_12 connected to the first substrate 330_1. The interface chip of the second stacked memory SME_12 receives the read command and transmits it to a corresponding (addressed) memory chip among the stacked memory chips on the second stacked memory SME_12, and the corresponding memory chip performs a read operation. The data read through the read operation is transmitted to the interface chip of the second stacked memory SME_12, the interface chip of the second stacked memory SME_12 transmits the read data to the interface chip of the third stacked memory SME_13, and then, the interface chip of the third stacked memory SME_13 transmits it to the interface chip of the fourth stacked memory SME_14. Continuing the above exemplary operation, the read data is eventually transmitted to the interface chip of the nth stacked memory SME_1n, and then, the interface chip of the nth stacked memory SME_1n transmits it to the controller 350.

In order to read data from the nth stacked memory SME_mn connected to the mth substrate 330_m, the controller 350 transmits a read command for reading the data from the nth stacked memory SME_mn to the interface chip of the first stacked memory SME_11 connected to the first substrate 330_1. Since the read command is related to the nth memory module 310_n, the interface chip of the first stacked memory SME_11 does not transmit the read command to the interface chip of the second stacked memory SME_12 connected to the first substrate 330_1, but instead transmits it to the interface chip of the first stacked memory SME_21 connected to the second substrate 330_2. Likewise, the interface chip of the first stacked memory SME_21 transmits the read command to the interface chip of the first stacked memory SME_31 connected to the third substrate 330_3. Such forwarding operations are performed by subsequent exemplary numbered substrates to cause the read command to be transmitted to the interface chip of the first stacked memory SME_m1 connected to the mth substrate 330_m. The read command is related to the nth stacked memory SME_mn of the mth memory module 310_m, and thus, the interface chip of the first stacked memory SME_m1 transmits the read command to the interface chip of the second stacked memory SME_m2 connected to the mth substrate 330_m. Such signal forwarding operations are sequentially performed to cause the read command to be transmitted to the interface chip of the nth stacked memory SME_mn connected to the mth substrate 330_m.

The interface chip of the nth stacked memory SME_mn receives the read command and transmits it to a corresponding (address) memory chip among the stacked memory chips on the nth stacked memory SME_mn, and the memory chip performs a read operation. The data read through the read operation is transmitted to the interface chip of the nth stacked memory SME_mn, and the interface chip of the nth stacked memory SME_mn transmits the read data to the interface chip of the nth stacked memory connected to the m−1th substrate. Then, the interface chip of the nth stacked memory connected to the m−1th substrate transmits the read data to the interface chip of the nth stacked memory connected to the m−2th substrate. Through the above operation, the read data is transmitted to the interface chip of the interface chip of the nth stacked memory SME_1n connected to the first substrate 330_1, and the interface chip of the nth stacked memory SME_1n transmits the read data to the controller 350.

Performing this exemplary signal transmission may reduce power consumption when transmitting a signal within the same memory module, and thereby reduce power consumption by the semiconductor memory device 300. For example, assume that a first signaling mode is used when a signal is transmitted within the same memory module and a second signaling mode is used when a signal is exchanged between the controller 350 and a memory module or between memory modules. In this case, it may be possible to reduce power consumption in the semiconductor memory device 300 by setting power consumption in the first mode to be less than in the second mode. The first or second mode may be selected for use via a register setting. That is, the stacked memories may be manufactured to operate according to both the first and second modes, and the first or second mode may be selected for use via the register so that the selected mode can be used in conjunction with a port of each of the stacked memories.

For example, it is assumed that a single signal is exchanged in the first signaling mode, and a pair of differential signals are transmitted in the second signaling mode. In this case, differential signals are exchanged between the controller 350 and the first memory module 310_1 since the second mode is used therebetween. In sharp contrast, a single signal is transmitted between the interface chips of the first and second stacked memory SME_11 and SME_12 of the first memory module 310_1 since the first signaling mode is used therebetween, which may thereby reduce the power consumption in the semiconductor memory device 300. Likewise, the differential signals are exchanged between the controller 350 and the first memory module 310_1 since the second signaling mode is used therebetween, and the single signal is exchanged between memory modules, e.g., the first memory module 310_1 and the second memory module 310_2, since the first mode is used therebetween, which may thereby reduce power consumption in the semiconductor memory device 300.

As another example, it is assumed that the amplitude of a signal that is transmitted according to the first mode is smaller than that of a signal that is transmitted according to the second mode. In this case, the amplitude of a signal transmitted from the interface chip of the first stacked memory SME_11 of the first memory module 310_1 to the interface chip of the second stacked memory SME_12 is smaller than that of a signal transmitted between the controller 350 and the first memory module 310_1, which may thereby reduce power consumption in the semiconductor memory device 300. Similarly, the amplitude of a signal exchanged between memory modules, e.g., the first memory module 310_1 and the second memory module 310_2, is smaller than that of a signal exchanged between the controller 350 and the first memory module 310_1, which may thereby reduce power consumption in the semiconductor memory device 300.

The interface chips and/or the controller 350 may be connected to one another in a daisy chain fashion. Also, the interface chips, e.g., the interface chips of the first stacked memory SME_11 and the second stacked memory SME_12, may be connected to one another within the same module not only in a daisy chain configuration but also in a fly-by configuration.

Figure 4:
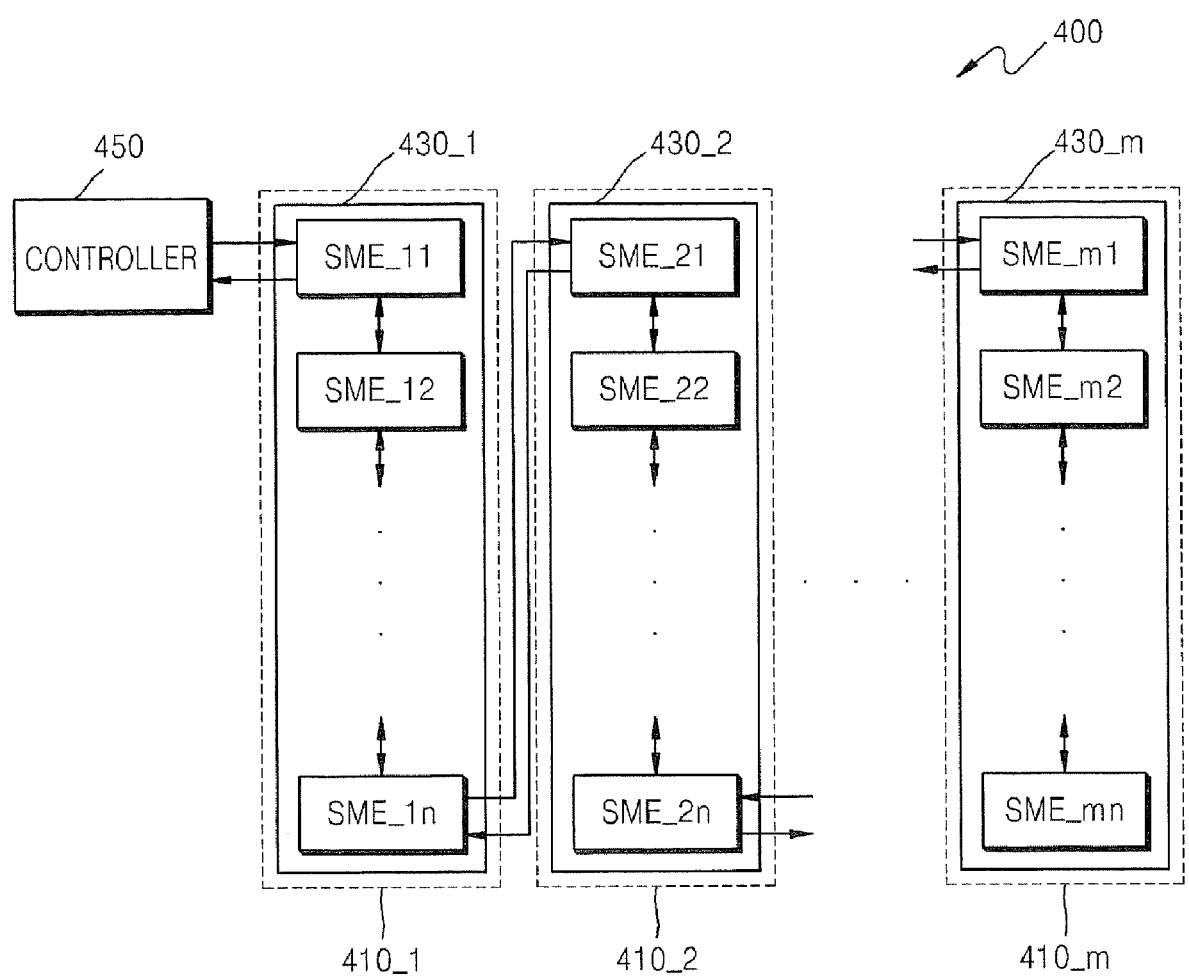
FIG. 4 is a block diagram of a semiconductor memory device according to other embodiments of the present invention.

FIG. 4 is a block diagram of semiconductor memory device 400 according to other embodiments of the present invention. Referring to FIGS. 3 and 4, the semiconductor memory device 400 may include first through mth memory modules 410_1, 410_2, . . . , 410_m, and a controller 450. The first through mth memory modules 410_1, 410_2, . . . , 410_m may be configured in a similar way to the first through mth memory modules 310_1, 310_2, . . . , 310_m illustrated in FIG. 3.

The controller 450 can exchange a signal, e.g., an address, a command, and/or data, with the first through mth memory modules 410_1, 410_2, . . . , 410_m. That is, the controller 450 can control the first through nth stacked memories SME_11 through SMN_mn connected to substrates 430_1 through 430_m by exchanging the signal with the first through nth stacked memories SME_11 through SMN_mn.

The controller 450 transmits a signal to an interface chip of the first stacked memory SME_11 connected to the first substrate 430_1. The interface chip of the first stacked memory SME_11 transmits the signal to an interface chip of the second stacked memory SME_12 connected to the first substrate 430_1. That is, the signal is transmitted to an interface chip of a stacked memory corresponding to the signal, and the signal output from the corresponding stacked memory is transmitted to the controller 450 via the same path through which the signal was transmitted.

For example, in order to read data from the second stacked memory SME_12 connected to the first substrate 430_1, the controller 450 transmits a read command for reading the data from the second stacked memory SME_12 to the interface chip of the first stacked memory SME_11 connected to the first substrate 430_1. Since the read command is related to the second stacked memory SME 430_2, the interface chip of the first stacked memory SME_11 transmits the read command to the interface chip of the second stacked memory SME_12 connected to the first substrate 430_1. The interface chip of the second stacked memory SME_12 receives the read command and transmits it to a corresponding (addressed) memory chip from among stacked memory chips mounted thereon, and the memory chip performs a read operation. The data read through the read operation is transmitted to the interface chip of the second stacked memory SME_12. The interface chip of the second stacked memory SME_12 transmits the read data to the interface chip of the first stacked memory SME_11, and the interface chip of the first stacked memory SME_11 transmits it to the controller 450.

For example, in order to read data from the nth stacked memory SME_mn connected to the mth substrate 430_m, the controller 450 transmits a read command for reading the data from the nth stacked memory SME_mn to the interface chip of the first stacked memory SME_11 connected to the first substrate 430_1. Since the read command is related to the nth stacked memory SME_mn, the interface chip of the first stacked memory SME_11 transmits the read command to the interface chip of the second stacked memory SME_12 connected to the first substrate 430_1. Likewise, the interface chip of the second stacked memory SME_12 transmits the read command to the interface chip of the third stacked memory SME_13. Such forwarding operations are sequentially performed to cause the read command to be transmitted to an interface chip of the nth stacked memory SME_1n connected to the first substrate 430_1. The interface chip of the nth stacked memory SME_1n connected to the first substrate 430_1 transmits the read command to an interface chip of the second substrate 430_2 connected to the first stacked memory SME_21. Such forwarding operations are sequentially performed to cause the read command to be transmitted to an interface chip of the nth stacked memory SME_mn connected to the mth substrate 430_m.

The interface chip of the nth stacked memory SME_mn receives the read command and transmits it to a corresponding memory chip from among stacked memory chips mounted thereon, and the corresponding memory chip performs a read operation. The data read through the read operation is transmitted to the interface chip of the nth stacked memory SME_mn, the interface chip of the nth stacked memory SME_mn transmits the read data to an interface chip of the n−1th stacked memory connected to the mth substrate 430_m, and then, the interface chip of the n−1th stacked memory connected to the mth substrate 430_m transmits the read data to an interface chip of the n−2th stacked memory connected to the mth substrate 430_m. Such forwarding operations are sequentially performed to cause the read data to be transmitted to the interface chip of the first stacked memory SME_11 connected to the first substrate 430_1 via the same path in which the read command was received. Then, the interface chip of the first stacked memory SME_11 transmits the read data to the controller 450.

Figure 5:
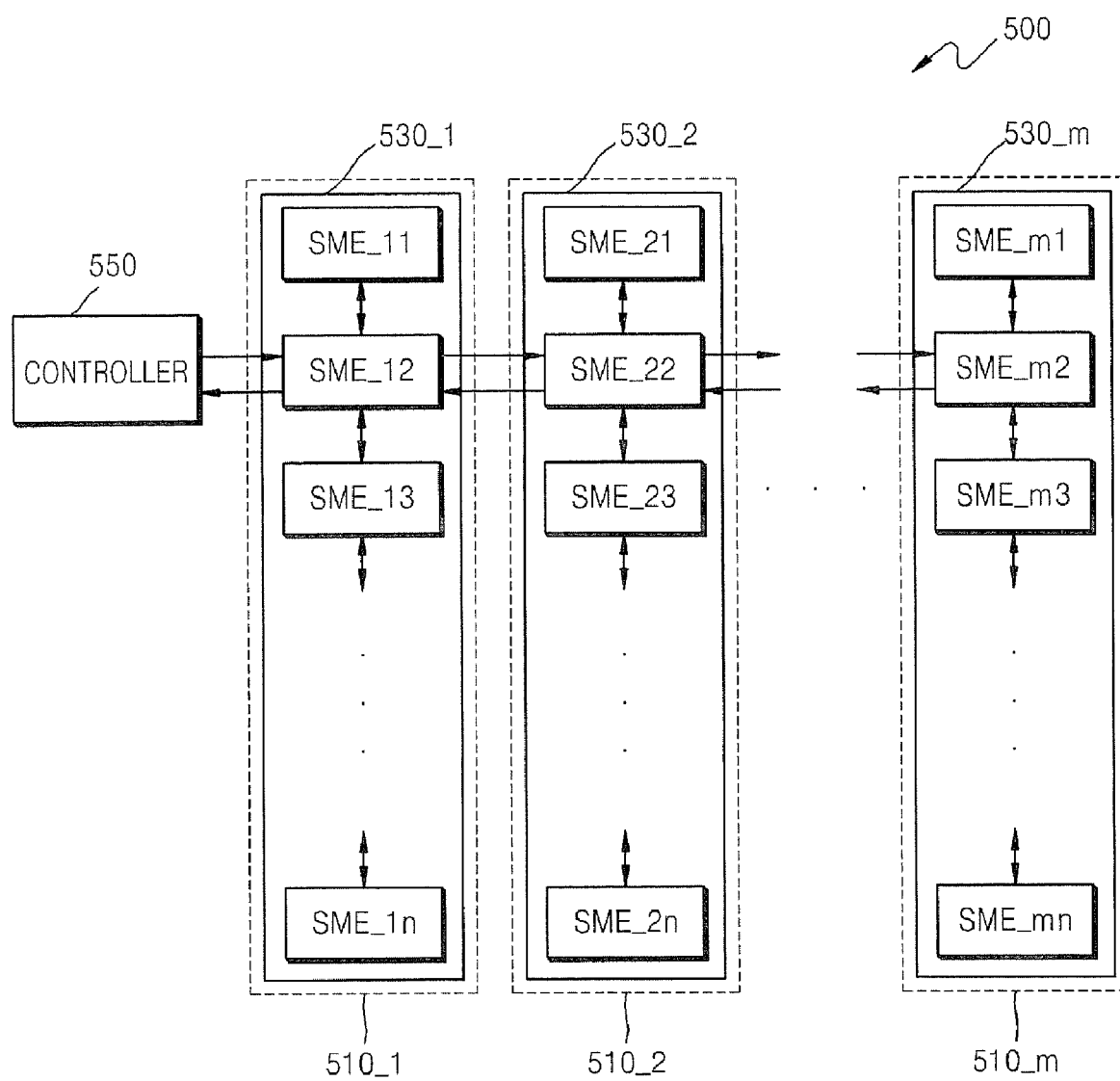
FIG. 5 is a block diagram of a semiconductor memory device according to other embodiment of the present invention.

FIG. 5 is a block diagram of a semiconductor memory device 500 according to other embodiments of the present invention Referring to FIGS. 3 through 5, the semiconductor memory device 500 may include first through mth memory modules 510_1, 510_2, . . . , 510_m, and a controller 550. The first through mth memory module 510_1, 510_2, . . . , 510_m may be configured in a similar way to the first through mth memory modules 310_1, 310_2, . . . , 310_m illustrated in FIG. 3.

The controller 550 can exchange a signal, such as an address, a command, and/or data, with the first through mth memory module 510_1, 510_2, . . . , 510_m. That is, the controller 550 can control the first through nth stacked memories SME_11 through SME_mn that are respectively connected to substrates 530_1 through 530_m by exchanging the signal with the first through nth stacked memories SME_11 through SME_mn.

The controller 550 exchanges a signal with an interface chip of the second stacked memory SME_12 connected to the first substrate 530_1. Although FIG. 5 illustrates that the controller 550 directly exchanges a signal with the interface chip of the second stacked memory SME_12 connected to the first substrate 530_1, it is not limited thereto and may instead directly exchange a signal with an interface chip of a stacked memory other than the first stacked memory SME_11 or the nth stacked memory SME_1n, which is connected to the first substrate 530_1.

If the signal is related to the first memory module 510_1, the interface chip of the second stacked memory SME_12 exchanges the signal with the interface chip of the first stacked memory SME_11 or the third stacked memory SME_13 connected to the first substrate 530_1. If the signal is related to the second memory module 510_2, the interface chip of the second stacked memory SME_12 exchanges the signal with an interface chip of the second stacked memory SME_22 connected to the second substrate 530_2. Although FIG. 5 illustrates that the interface chip of the second stacked memory SME_12 directly exchanges a signal with the Interface chip of the second stacked memory SME_22 connected to the second substrate 530_2, it is not limited thereto and may instead directly exchange the signal with an interface chip of another stacked memory connected to the second substrate 530_2.

For example, in order to read data from the third stacked memory SME_13 connected to the first substrate 530_1, the controller 550 transmits a read command for reading the data from the third stacked memory SME_13 to the interface chip of the second stacked memory SME_12 connected to the first substrate 530_1. Since the read command is related to the third stacked memory SME_13 of the first memory module 510_1, the interface chip of the second stacked memory SME_12 does not transmit the read command to the interface chip of the second stacked memory SME_22 connected to the second substrate 530_2 but transmits it to the interface chip of the third stacked memory SME_13 connected to the first substrate 530_1. The interface chip of the third stacked memory SME_13 receives the read command and transmits it to a corresponding memory chip from among stacked memory chips, and the corresponding memory chip performs a read operation. The data read through the read operation is transmitted to the interface chip of the third stacked memory SME_13, the interface chip of the third stacked memory SME_13 transmits the read data to the interface chip of the second stacked memory SME_12, and then, the interface chip of the second stacked memory SME_12 transmits the read data to the controller 550.

For example, in order to read data from the nth stacked memory SME_mn connected to the mth substrate 530_m, the controller 550 transmits a read command for reading the data from the nth stacked memory SME_mn to the interface chip of the first stacked memory SME_11 connected to the first substrate 530_1. Since the read command is related to the nth memory module 510_n, the interface chip of the second stacked memory SME_12 does not transmit the read command to the interface chip of the first stacked memory SME_11 or the third stacked memory SME_13 connected to the first substrate 530_1 but transmits the read command to the interface chip of the second stacked memory SME_22 connected to the second substrate 530_2. Likewise, the interface chip of the second stacked memory SME_22 transmits the read command to the interface chip of the second stacked memory SME_32 connected to the third substrate 530_3. Such 40 operations are sequentially performed to cause the read command to be transmitted to the interface chip of the second stacked memory SME_m2 connected to the mth substrate 530_m. Since the read command is related to the nth stacked memory SME_mn of the mth memory module 510_m, the interface chip of the second stacked memory SME_m2 does not transmit the read command to the interface chip of the first stacked memory SME_m1 but transmits it to the interface chip of the third stacked memory SME_m3. Such porting operations are sequentially performed to cause the read command to be transmitted to the interface chip of the nth stacked memory SME_mn connected to the mth substrate 530_m.

The interface chip of the nth stacked memory SME_mn receives the read command and transmits it to a corresponding memory chip from among the stacked memory chips, and the corresponding memory chip performs a read operation. The data read through the read operation is transmitted to the interface chip of the nth stacked memory SME_mn, the interface chip of the nth stacked memory SME_mn transmits the read data to the interface chip of the n−1th stacked memory connected to the mth substrate 430_m, and then, the interface chip of the mth substrate 430_m connected to the n−1th stacked memory transmits the read data to the interface chip of the n−2th stacked memory connected to the mth substrate 430_m. Such forwarding operations are sequentially performed to cause the read data to be transmitted to the interface chip of the second stacked memory SME_m2 connected to the mth substrate 530_m. The interface chip of the second stacked memory SME_m2 transmits the read data to the interface chip of the second stacked memory connected to the m−1th substrate, and the interface chip of the second stacked memory connected to the m−1th substrate transmits the read data to the interface chip of the second stacked memory connected to the m−2th substrate. Through these operations, the read data is transmitted to the interface chip of the second stacked memory SME_12 connected to the first substrate 530_1, and the interface chip of the second stacked memory SME_12 transmits the read data to the controller 550.

As illustrated in FIGS. 3, 4, and 5, according to various embodiments of the present invention, it may be possible to reduce power consumption in the semiconductor memory devices 400 and 500 by reducing power consumption when transmitting a signal within the same memory module. That is, as described above, the exemplary first operational mode is used when a signal is exchanged within the same memory module, and the exemplary second operational mode is used when a signal is exchanged between the controller 450 (or 550) and a memory module or between memory modules, which may thereby reduce power consumption in the semiconductor memory device 400 (or 500). The first mode and the second mode may operate as described above. The interface chips and/or the controller 450 (or 550) may be connected to one another in a daisy chain configuration.

The memory modules illustrated in FIGS. 3 through 5 may be configured as FBDIMMs. In this case, a signal exchanged between a controller and a memory module or between memory modules may be subject to an FBDIMM protocol complying with one or more specifications from the Joint Electron Device Engineering Council (JEDEC). However, the various embodiments are not limited to of a signal within the same memory module subject to the FBDIMM protocol according to the JEDEC.

Accordingly, various embodiments of a semiconductor memory device include a memory module in which a plurality of memory chips are stacked, and which are configured so as to potentially reduce not only power consumption when exchanging a signal within the memory module but also potentially reduce the length of a communication channel through which the signal is transmitted.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
   first through mth substrates, wherein m is a natural number greater than 1;
   first through nth stacked memories spaced apart and connected to each of the first through mth substrates, each of the first through nth stacked memories including an interface chip that is connected to the respective substrate and further including a plurality of memory chips stacked on the interface chip, wherein n is a natural number; and
   a controller for controlling the first through nth stacked memories connected to each of the first through mth substrates,
   wherein each interface chip of the first through nth stacked memories is connected to a neighboring one of the interface chips of the first through nth stacked memories,
   wherein the controller is connected to the interface chip of the first stacked memory of the first substrate, and the controller is connected to the interface chip of the nth stacked memory of the first substrate,
   wherein a kth one of the interface chips transmits a signal including at least one of command and data to a k+1th interface chip connected to the same substrate, wherein k is a natural number that is equal to or greater than 1 and is less than or equal to n−1, and
   wherein the controller transmits the signal to the first one of the interface chips connected to the first substrate and receives read data from the nth interface chip connected to the first substrate.

2. The semiconductor memory device of claim 1,
   wherein the controller controls the first through nth stacked memories connected to each of the first through mth substrates,
   wherein the controller transmits a read command, which is directed to the k+1th interface chip connected to the first substrate, to the first one of the interface chips connected to the first substrate and which forwards the read command through the kth interface chip to the k+1th interface chip connected to the first substrate, and the controller receives read data from the k+1th interface chip connected to the first substrate via forwarding through the nth interface chip.

3. The semiconductor memory device of claim 2 wherein the kth interface chip forwards the read command to the k+1th interface chip using a first signaling mode;
   wherein the controller transmits the read command to the first interface chip and receives the read data from the nth interface chip using a second signaling mode that is different than the first signaling mode, and
   wherein the controller and stacked memories are configured so that power consumption in the first signaling mode is less than in the second signaling mode.

4. The semiconductor memory device of claim 3, wherein the controller transmits the read command using the second signaling mode by transmitting a pair of differential signals to the first interface chip and receives the read data using a pair of differential signals from the nth interface chip.

5. The semiconductor memory device of claim 2, wherein the kth interface chip is connected to the k+1th interface chip in a fly-by configuration or a daisy chain configuration.

6. The semiconductor memory device of claim 1,
   wherein the controller controls the first through nth stacked memories connected to each of the first through mth substrates,
   wherein the controller transmits a read command, which is directed to the first interface chip connected to an a+1th substrate, through the first interface chip connected to an ath substrate, wherein a is a natural number equal to or greater than 1 and less than or equal to m−1;
   the first interface chip connected to the ath substrate responds to the read command by transmitting the read command to the first interface chip connected to the a+1th substrate; and
   the nth interface chip connected to the ath substrate receives read data from the nth interface chip connected to the a+1th substrate.

7. The semiconductor memory device of claim 6, wherein the first interface chip connected to the ath substrate transmits the read command to the first interface chip connected to the a+1th substrate using a first signaling mode;
   wherein the nth interface chip connected to the ath substrate receives the read data from the nth interface chip connected to the a+1th substrate using the first signaling mode;
   wherein the controller transmits the read command to the first interface chip connected to the a+1th substrate and receives the read data from the nth interface chip connected to the a+1th substrate using a second signaling mode that is different than the first signaling mode; and
   wherein the controller and the stacked memories are configured so that power consumption in the first signaling mode is less than or equal to power consumption in the second signaling mode.

8. The semiconductor memory device of claim 6,
   wherein the controller transmits the read command using a second signaling mode by transmitting a pair of differential signals to the first interface chip connected to the ath substrate and receives the read data using a pair of differential signals from the nth interface chip connected to the a+1th substrate;
   wherein the first interface chip connected to the ath substrate responds to the pair of differential signals by transmitting according to the first signaling mode using a pair of differential signals or a single signal to the first interface chip connected to the a+1th substrate; and wherein the nth interface chip connected to the ath substrate receives according to the first signaling mode a pair of differential signals or a single signal from the nth interface chip connected to the a+1th substrate.

9. A semiconductor memory device comprising:
first through mth substrates, wherein m is a natural number greater than 1;
first through nth stacked memories spaced apart and connected to each of the first through mth substrates, each of the first through nth stacked memories including an interface chip that is connected to the respective substrate and further including a plurality of memory chips stacked on the interface chip, wherein n is a natural number; and
a controller for controlling the first through nth stacked memories connected to each of the first through mth substrates,
wherein each interface chip of the first through nth stacked memories is connected to a neighboring one of the interface chips of the first through nth stacked memories,
wherein the controller is connected to the interface chip of the first stacked memory of the first substrate, and the controller is connected to the interface chip of the nth stacked memory of the first substrate,
wherein a kth one of the interface chips exchanges a signal including at least one of command and data with a k+1 th interface chip connected to the same substrate, wherein k is a natural number that is equal to or greater than 1 and is less than or equal to n−1, and
wherein the controller exchanges the signal with the first interface chip connected to the first substrate to read data from one of the stacked memories on one of the substrates other than the first substrate.

10. The semiconductor memory device of claim 9,
wherein the controller controls the first through nth stacked memories connected to each of the first through mth substrates,
wherein the controller exchanges signals with the first interface chip connected to the first substrate to read data from one of the stacked memories on one of the substrates other than the first substrate.

11. The semiconductor memory device of claim 10, wherein
the kth interface chip exchanges a signal with the k+1th interface chip using a first signaling mode;
the controller exchanges a signal with the first interface chip using a second signaling mode that is different than the first signaling mode; and
the controller and stacked memories are configured so that power consumption in the first signaling mode is less than in the second signaling mode.

12. The semiconductor memory device of claim 10, wherein the controller transmits and receives signals using the second signaling mode by transmitting a pair of differential signals to the first interface chip and receiving a pair of differential signals from the nth interface chip.

13. The semiconductor memory device of claim 9,
wherein the controller controls the first through nth stacked memories connected to each of the first through mth substrates, wherein:
the controller transmits a command signal, which is directed to the first interface chip connected to an a+1th substrate, through the nth interface chip connected to an ath substrate, wherein a is a natural number equal to or greater than 1 and less than or equal to m−1;
the nth interface chip connected to the ath substrate responds to the command signal, by transmitting the command signal to the first interface chip connected to the a+1th substrate; and
the nth interface chip connected to the ath substrate receives a response signal from the first interface chip connected to the a+1th substrate.

14. The semiconductor memory device of claim 13, wherein
the nth interface chip connected to the ath substrate exchanges a signal with the first interface chip connected to the a+1th substrate using a first signaling mode;
the controller exchanges a signal with the first interface chip using a second signaling mode that is different than the first signaling mode; and
the controller and the stacked memories are configured so that power consumption in the first signaling mode is less than or equal to power consumption in the second signaling mode.

15. The semiconductor memory device of claim 13, wherein
the controller exchanges a pair of differential signals with the first interface chip using the second signaling mode; and
the nth interface chip connected to the ath substrate exchanges a pair of differential signals or a single signal with the first interface chip connected to the a+1th substrate using the first signaling mode.

16. The semiconductor memory device of claim 9,
wherein the controller controls the first through nth stacked memories connected to each of the first through mth substrates,
wherein the controller exchanges a signal with an ith interface chip connected to the first substrate, and wherein i is a natural number equal to or greater than 2 and less than or equal to n−1.

17. The semiconductor memory device of claim 16, wherein
the kth interface chip exchanges a signal with the k+1th interface chip using a first signaling mode;
the controller exchanges a signal with the ith interface chip using a second signaling mode that is different than the first signaling mode; and
the controller and the stacked memories are configured so that power consumption in the first signaling mode is less than in the second signaling mode.

18. The semiconductor memory device of claim 16, wherein the ith interface chip connected to an ath substrate exchanges a signal with the ith interface chip connected to an a+1th substrate, wherein a is a natural number equal to or greater than 1 and less than or equal to m−1.

19. The semiconductor memory device of claim 18, wherein
the ith interface chip connected to the ath substrate exchanges a signal with the ith interface chip connected to the a+1th substrate using a first signaling mode;
the controller exchanges a signal with the ith interface chip using a second signaling mode that is different than the first signaling mode; and
the controller and the stacked memories are configured so that power consumption in the first signaling mode is less than or equal to power consumption in the second signaling mode.

20. The semiconductor memory device of claim 1,
wherein each interface chip of the first stacked memory of the first through mth substrates is connected to the interface chip of the first stacked memory of a neighboring substrate, and each interface chip of the nth stacked memory of the first through mth substrates is connected to the interface chip of the first stacked memory of a neighboring substrate.

21. The semiconductor memory device of claim 9, wherein each interface chip of the first stacked memory of the first through mth substrates is connected to the interface chip of the first stacked memory of a neighboring substrate, and each interface chip of the nth stacked memory of the first through mth substrates is connected to the interface chip of the first stacked memory of a neighboring substrate.

* * * * *